US008157497B2

(12) United States Patent
Loretta et al.

(10) Patent No.: US 8,157,497 B2
(45) Date of Patent: Apr. 17, 2012

(54) METHOD AND LOADER APPARATUS FOR TEM MACHINE WORK CHAMBER DEVICE

(75) Inventors: Miles Edmond Loretta, Greenville, SC (US); Daryl Duane Perkins, Clinton Township, MI (US); Axel Willi Kieser, Ingersheim (DE)

(73) Assignee: Kennametal Inc., Latrobe, PA (US)

( * ) Notice: Subject to any disclaimer, the term of this patent is extended or adjusted under 35 U.S.C. 154(b) by 1016 days.

(21) Appl. No.: 12/115,566

(22) Filed: May 6, 2008

(65) Prior Publication Data
US 2009/0279988 A1 Nov. 12, 2009

(51) Int. Cl.
*B65H 1/00* (2006.01)
(52) U.S. Cl. ................. 414/226.04; 414/160; 414/744.2
(58) Field of Classification Search ............. 414/226.04, 414/160, 167, 172, 209, 199, 744.1, 744.2; 901/22; 266/249, 276
See application file for complete search history.

(56) References Cited

U.S. PATENT DOCUMENTS

| 827,498 | A | * | 7/1906 | Benjamin ..................... 432/138 |
|---|---|---|---|---|
| 3,475,229 | A | | 10/1969 | Geen et al. |
| 3,666,252 | A | | 5/1972 | Rice |
| 3,992,138 | A | | 11/1976 | Leisner |
| 4,025,062 | A | | 5/1977 | Johnstone et al. |
| 4,269,677 | A | | 5/1981 | Blomsterberg |
| 4,486,173 | A | | 12/1984 | Hieber et al. |
| 4,760,630 | A | | 8/1988 | Conrad et al. |
| 4,796,868 | A | | 1/1989 | Bozhko et al. |
| 4,819,917 | A | | 4/1989 | Cherendin et al. |
| 4,925,499 | A | | 5/1990 | Wohr |
| 5,265,851 | A | * | 11/1993 | Beuret et al. ................. 266/262 |
| 6,435,799 | B2 | * | 8/2002 | Goodwin et al. ........ 414/225.01 |
| 7,264,436 | B2 | | 9/2007 | Tillmann |
| 7,264,768 | B2 | * | 9/2007 | Tuttle et al. .................. 266/249 |
| 2006/0192327 | A1 | | 8/2006 | La Gala |
| 2007/0212200 | A1 | * | 9/2007 | Ueda et al. ..................... 414/217 |
| 2009/0245983 | A1 | * | 10/2009 | Law et al. ................ 414/226.04 |

FOREIGN PATENT DOCUMENTS

| EP | 1693137 A2 | 8/2006 |
|---|---|---|
| JP | 2000-343475 | 12/2000 |
| JP | 2001-110874 A | 4/2001 |
| KR | 10-2004-0104469 | 12/2004 |
| WO | WO 03-033220 | 4/2003 |
| WO | WO 2009/137542 | 11/2009 |

OTHER PUBLICATIONS

Extrude Hone to Debut New Single Station Thermal Energy Method (http://www.kennametal.com/en/common/global_Print.jhtml) Aug. 2, 2007, Irwin, Pennsylvania.

* cited by examiner

*Primary Examiner* — Joshua Rudawitz
(74) *Attorney, Agent, or Firm* — Matthew W. Smith

(57) ABSTRACT

A loader assembly for a TEM machine having a retractable arm that is moveable between a retracted position and an extended position. A hoop portion of the retractable arm also moves between the retracted position and the extended position. A lower closure for holding a part to be processed in the TEM machine is removably positioned in the hoop portion. A ram piston of the TEM machine is movable between a load position and a process position. When the ram piston moves from a load position to a process position the ram piston contacts the lower closure and extends through the hoop of the retractable arm to move the lower closure to the process position. A thermal chamber receives the lower closure when the ram piston moves to the process position.

16 Claims, 5 Drawing Sheets

METHOD AND LOADER APPARATUS FOR TEM MACHINE WORK CHAMBER DEVICE

FIELD OF THE INVENTION

The present invention is directed to a loader assembly for a work station employing a thermal energy method for deburring and deflashing parts.

BACKGROUND OF THE INVENTION

Thermal energy method (TEM) machines use short bursts of intense heat to simultaneously deburr and deflash internal and external surfaces of a work piece without affecting or compromising adjoining component surfaces. TEM machines can be used on a wide range of work pieces that have undergone the machining process or have undergone machining and shaping. Typically TEM machines are larger in size and utilize an assembly line type of part loading system. An example of the loader for TEM machine is a rotary table having parts aligned along the circumference of the table. The table rotates the pieces into a work area where the TEM process is carried out. Such machines are used for processing a high volume of parts, are quite large and take up significant amount of facility space. In short, these larger TEM machines and their loaders are not always practical for small run applications or facilities with limited space. Thus, there is a need for reducing the overall size of the TEM machine by developing new and improved loader assemblies.

SUMMARY OF THE INVENTION

The present invention relates to a loader assembly for a TEM machine having a retractable arm that is moveable between a retracted position and an extended position. A hoop portion of the retractable arm also moves between the retracted position and the extended position. A lower closure for holding a part to be processed in the TEM machine is removably positioned in the hoop portion. A ram piston of the TEM machine is movable between a load position and a process position. When the ram piston moves from a load position to a process position the ram piston contacts the lower closure and extends through the hoop of the retractable arm to move the lower closure to the process position. A thermal chamber receives the lower closure when the ram piston moves to the process position.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
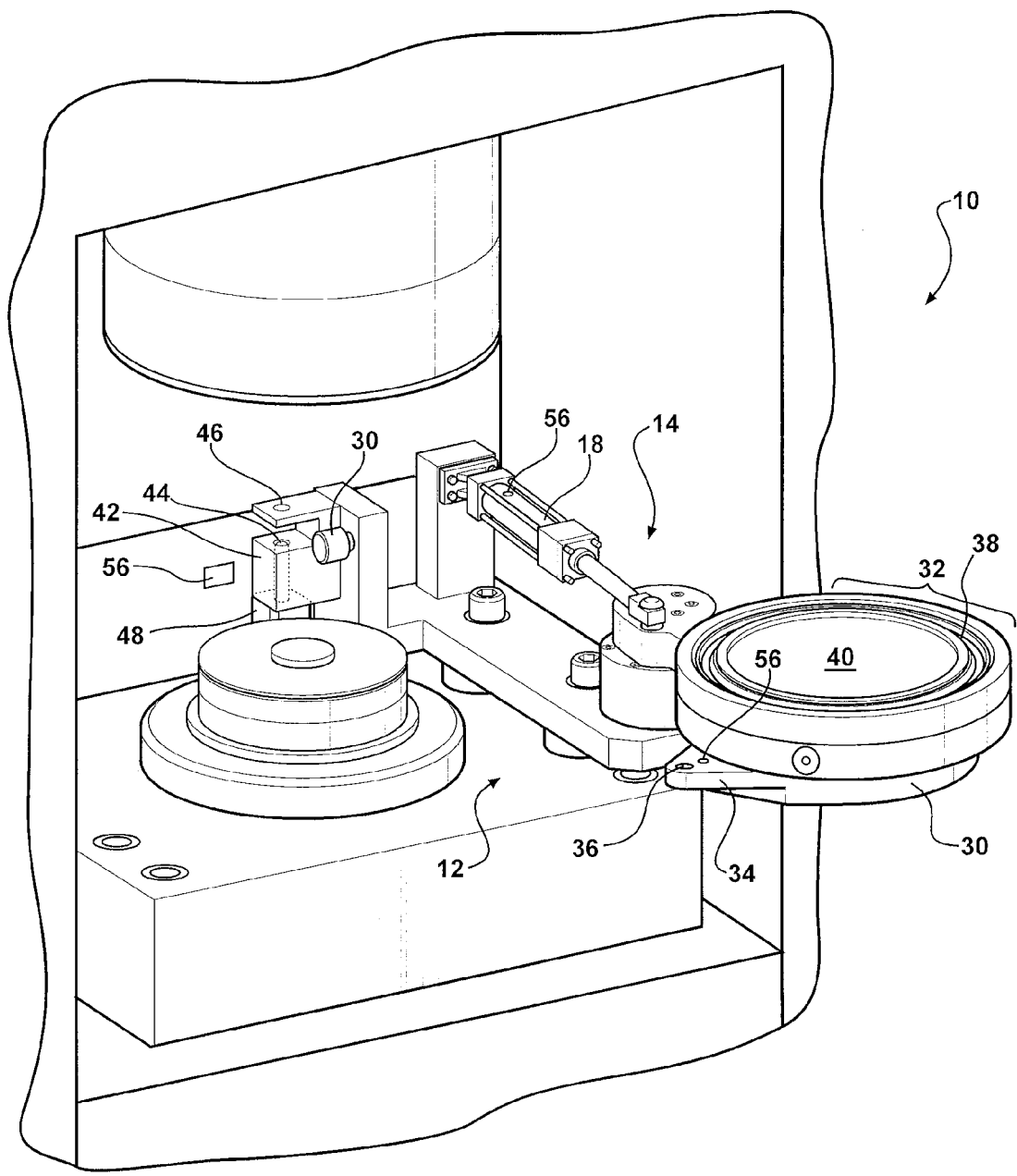
FIG. 1 is a perspective view of the loader assembly as used in a TEM machine wherein the retractable arm is in the extended position.
Figure 2:
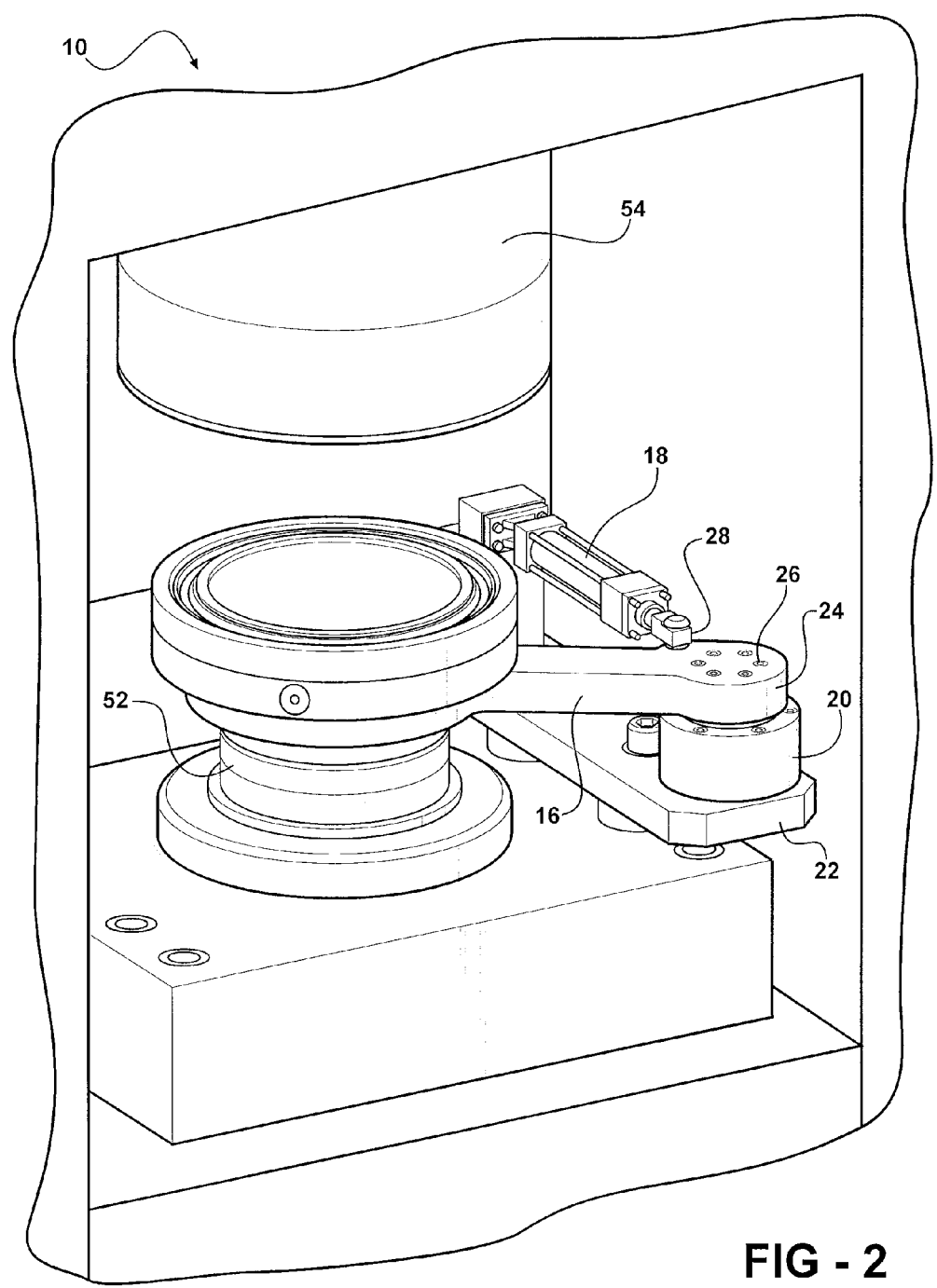
FIG. 2 is a perspective view of the loader assembly, wherein the retractable arm is in the retracted position.

Referring now to FIGS. 1 and 2, a thermal energy method (TEM) machine 10 is shown with a loader assembly 12 in accordance with one embodiment of the present invention. The loader assembly 12 has a base 22 upon which the components of the loader assembly 12 are connected. The base 22 is not necessarily required for all embodiments of the invention; however, it provides a way of quickly installing the loader assembly 12 and ensuring alignment of all the components. The loader assembly 12 includes a retractable arm 14 that pivots between an extended position and a retracted position. FIG. 1 shows the retractable arm 14 in the extended position, while FIG. 2 shows the retractable arm 14 in the retracted position.

The retractable arm 14 includes a pivot arm 16 and an actuator 18. The pivot arm 16 pivots about a point which is located on an upper clevis 24 of the pivot arm 16. The upper clevis 24 is rotatably connected to a stationary clevis 22. Bearing members 26 are located between the lower stationary clevis 20 and upper clevis 24 to facilitate the rotation. While the pivot arm 16 is described herein as having an upper and lower clevis to facilitate the rotation of the pivot arm 16 between the extended and retracted position, it is within the scope of this invention to have a different type of rotation arrangement. For example, a hinge or shaft with pin can be used to rotate the pivot arm 16 between the extended position and the retracted position.

The actuator 18 is connected to the upper clevis 24 at a connector joint 28. The actuator 18 as shown is a telescopic hydraulic cylinder that extends and retracts and forces the pivot arm 16 to rotate. While the actuator 18 is shown as being hydraulic, it is possible for the actuator to be something other than a hydraulic actuator, for example, a mechanical worm drive, a mechanical lever driven by a motor, or an electromechanical device can be used in the place of an actuator. Essentially the actuator 18 can be any type of device that provides enough force to provide the push/pull type of force required to the pivot arm 16. As shown in FIGS. 1 and 2, the actuator 18 is connected to a hinge 29 that is connected to a column 29. The column 29 extends from the base 22 of the loader assembly 12.

Figure 5:
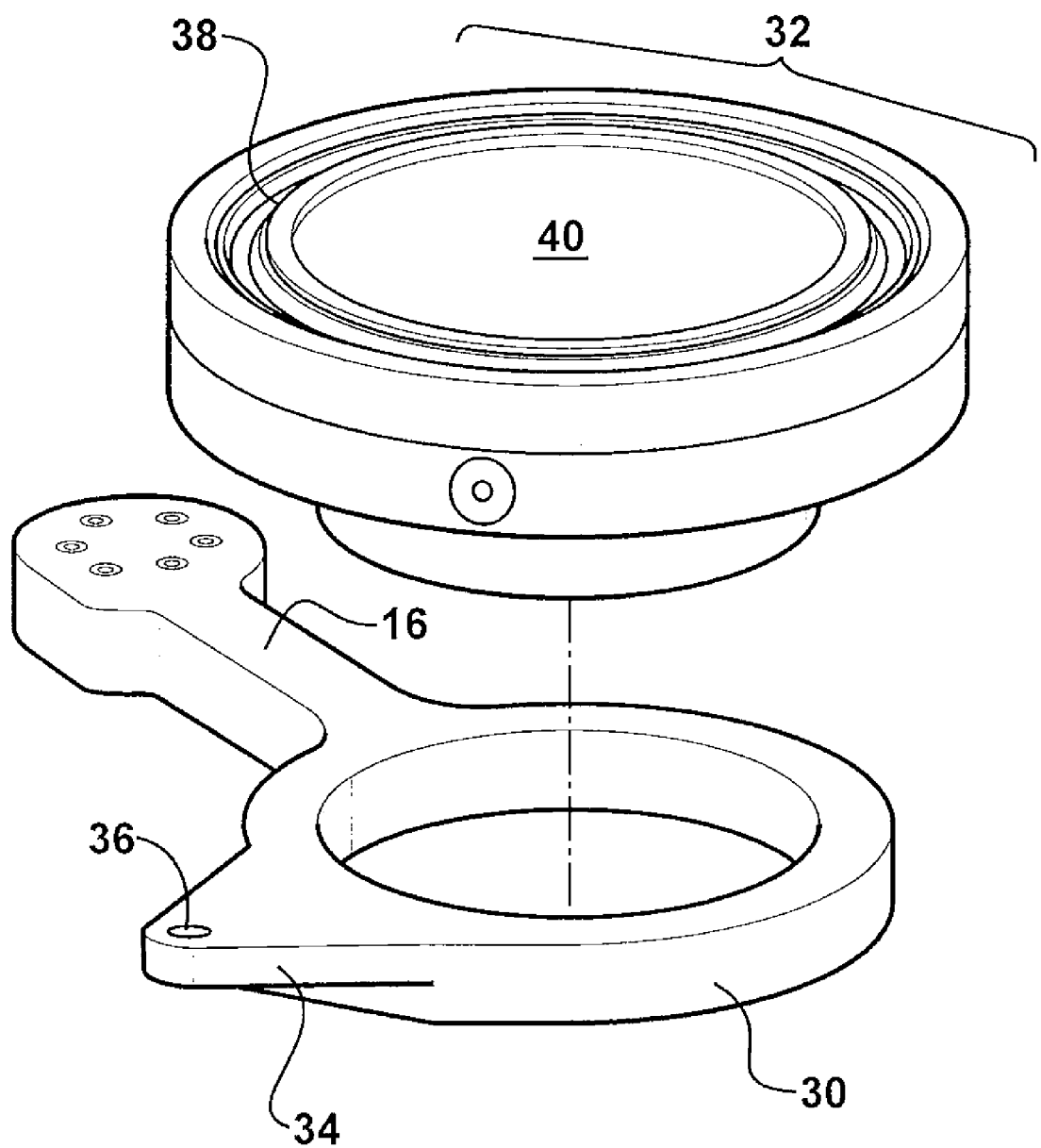
FIG. 5 is an exploded perspective view of the pivot arm and lower closure.

The pivot arm 16 also has a hoop portion 30 that moves between the extended and retracted position. The hoop portion 30 is best shown in FIG. 5 and is a frame or ring with an aperture through the center. The hoop portion 30 is configured to receive a lower closure 32. The lower closure 32 has a portion that sets through the aperture of the hoop portion 30. The lower closure 32 is used to hold a part in a part holder area 40. A seal 38 at the lower closure 32 is also present around the part holder area 40, and its function is described below.

The hoop portion 30 has an alignment tab 34 with a pin shaft hole or alignment hole 36. When the retractable arm moves from the extended position to the retracted position, the alignment tab 34 is configured to slide into a shot pin 42 which is connected to the base 22 of the loader assembly 12. The shot pin 42 has an alignment hole 46 that aligns with the alignment hole 36 of the alignment tab 34. A pin 44 contained in a small cylinder 48 extends through the alignment holes 36, 46 when the alignment tab 34 is aligned with the shot pin 42. The extension of the alignment pin 44 holds the retractable arm 16 in place during the TEM process. Additionally, the shot pin 42 also has a stop 50, which can be a metal stop to prevent the hoop portion 30 of the pivot arm 16 from banging against the shot pin 42 during rotation. The stop 50 is an optional component and does not necessarily have to be formed of metal but could also include a softer substance such as rubber.

The TEM machine 10 also includes a ram piston 52 which extends from a load position upward vertically to a process position. A thermal chamber 54 is located above the ram piston 52. The thermal chamber 54 is where parts or components are processed. When the hoop portion 30 of the pivot arm 16 moves from the extended position to the retracted position the alignment tab 34 moves into position with respect to the shot pin 42.

When the pin 44 from the small cylinder 48 extends through the alignment hole 36 of the alignment tab 34 and the alignment hole 46 of the shot pin 42, the ram piston 52 is aligned with the aperture of the hoop portion 30, lower closure 32, and the thermal chamber 54. At this point the ram piston 52 is in the load position below the hoop portion 30 and lower closure 32. The ram piston 52 is then moved vertically upward to contact the bottom of the lower closure 32 and raise the lower closure 32 off of the hoop portion 30, with the ram piston 52 extending through the aperture of the hoop portion 30. The ram piston 52 continues to move vertically upward to a load position where the lower closure 32 presents a part located in the part holder area 40 to the thermal chamber 54. The seal 38 on the lower closure aligns with the thermal chamber 54 to form a seal between the thermal chamber 54 and the lower closure 32 SO that the part can be processed. At this point, the ram piston 52 is in the process position. Once the TEM process is carried out, the ram piston 52 lowers from the process position back to the load position and the lower closure 32 is set back into position on the hoop portion 30. The pivot arm 16 moves from the retracted position to the extended position where a processed part is then unloaded from the part holder area and a new part to be processed is placed onto the holder area.

Figure 3:
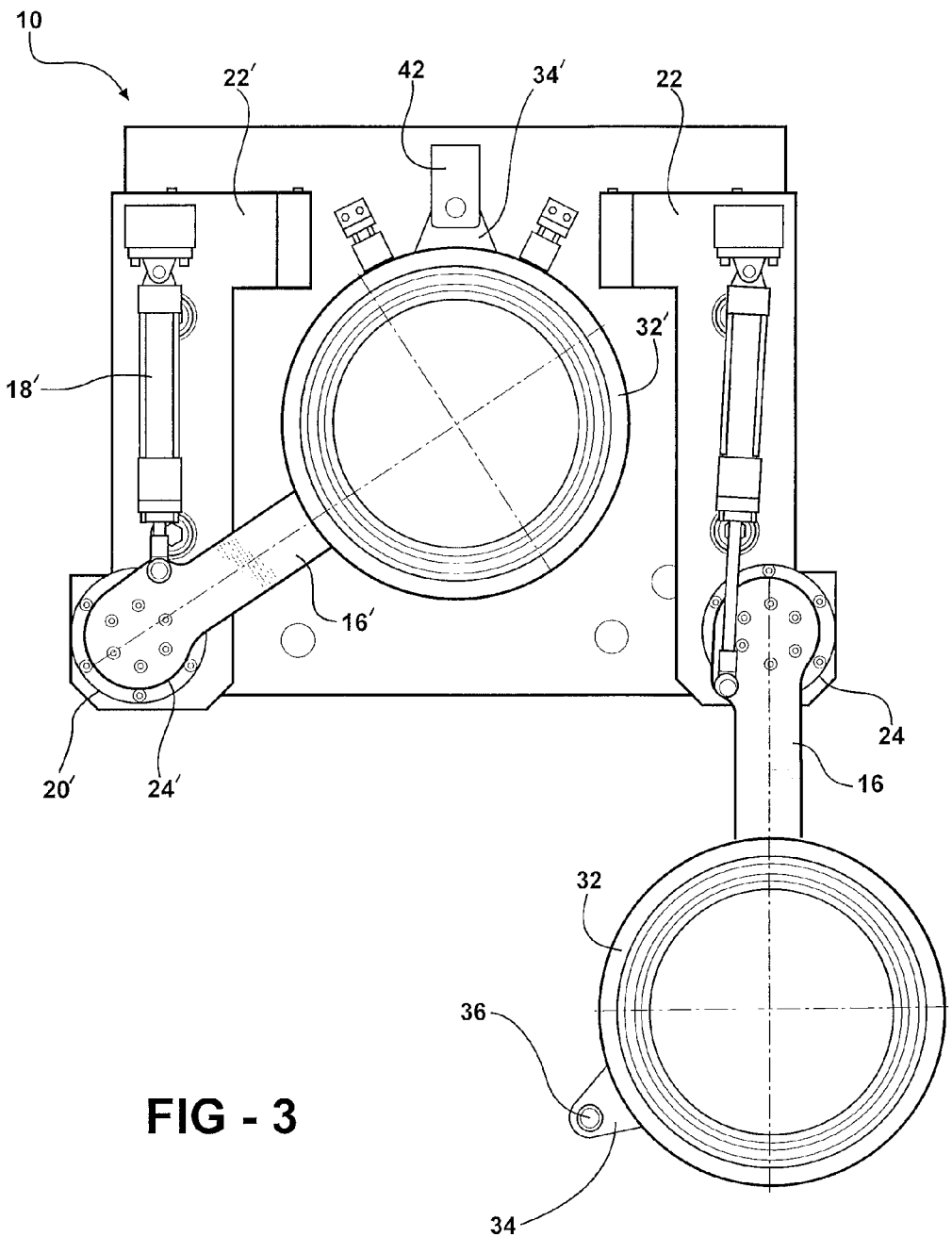
FIG. 3 is an overhead plan view of an alternate embodiment of a loader assembly incorporating the use of two retractable arms which are synchronized to move between the retracted and extended positions.
Figure 4:
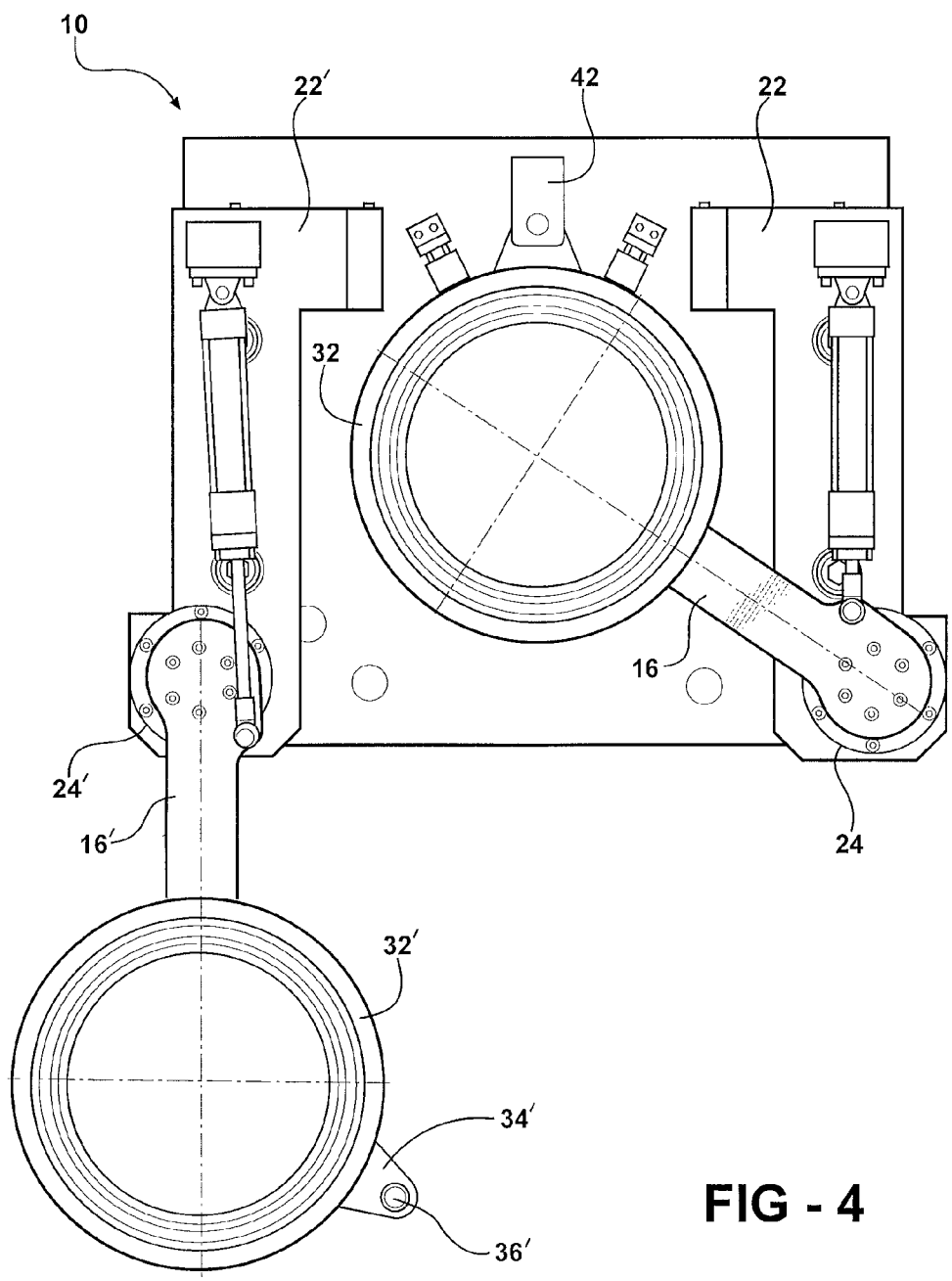
FIG. 4 is an overhead plan view of the alternate embodiment depicted in FIG. 3 with the two retractable arms in positions opposite those shown in FIG. 3.

Referring now to FIGS. 3 and 4, an alternate embodiment of the invention is shown. This alternate embodiment of the invention has a TEM machine 10' has two bases 20, 22' each supporting a retractable arm 14, 14' configured to move between a retracted position and an extended position in sequential fashion. It is within the scope of this invention to have a single base member with both retractable arms mounted thereon; however, it is not entirely necessary. This allows a user of the TEM machine 10' to load parts onto one retractable arm while a part on the second retractable arm is being processed. This increases the overall production of the TEM machine 10' since parts can be constantly loaded and unloaded. In this embodiment the retractable arm is a first retractable arm. The first retractable arm 14 and the second retractable 14' operate in essentially the same manner with the primary difference being their position with respect to the ram piston 52. The two arms can be arranged at opposite, adjacent, or vertically with respect to one another about the ram piston 52. The second retractable arm 14' has a pivot arm 16' having a hoop portion 30' with a lower closure 32' placed thereon as well as an actuator 18'. A shot pin 42' in this alternate embodiment of the invention is configured in a slightly different manner such that it is positioned to receive both the first retractable arm 14 and the second retractable arm 14' and eliminate the need for a second shot pin.

When the first retractable arm 14 is in the extended position, the second retractable arm 14' can be moved to the retracted position and a part on the lower closure 32' of the second retractable arm 14' can be processed in the thermal chamber (not shown). After the part on the lower closure 32' is processed in the same manner as described above with respect to FIGS. 1 and 2, the second retractable arm 14' pivots from the retracted position to the extended position and the first retractable arm 14, which has a fresh part loaded thereon, moves from the extended position to the retracted position in a sequential manner. The part on the first retractable arm 14 is then processed in the same manner as described above with respect to FIGS. 1 and 2, while the processed part on the second retractable arm 14' is removed and a fresh part is loaded onto the lower closure 32'.

In another aspect of the present invention, one or more sensors 56 can be incorporated into the various components of the TEM machine 10. For example, a sensor 56 can be implemented on the actuator 18, the alignment tab 34, or near the shot pin 42. The sensor can be any type of sensor suitable for determining the position of the pivot arm 14. For example, the sensors 56 could be proximity sensors that determine the presence or absence of the pivot arm at a certain location, contact sensors that are activated when two components come into contact or any other suitable sensor device. Additionally, a sensor associated with the actuator 18 may determine the extension or retraction of the actuator. Thus, another aspect of the invention involves controlling the method of operation of the loader assembly 12 by coordinating with the sensors.

The description of the invention is merely exemplary in nature and, thus, variations that do not depart from the gist of the invention are intended to be within the scope of the invention. Such variations are not to be regarded as a departure from the spirit and scope of the invention.

What is claimed is:
1. A loader assembly comprising:
    a retractable arm moveable between a retracted position and an extended position;
    a hoop portion of the retractable arm moveable between the retracted position and the extended position;
    a lower closure removeably positioned in the hoop portion;
    a ram piston moveable between a load position and a process position, wherein the ram piston contacts the lower closure, extends through the hoop portion, and moves the lower closure to the process position when the ram piston moves from the load position to the process position;
    a thermal chamber for receiving the lower closure when the ram piston moves to the process position;
    an alignment tab extending from the hoop portion, wherein the alignment tab has one or more alignment holes; and
    a shot pin with one or more alignment holes and one or more retractable pins capable of sliding through the one or more alignment holes of the shot pin and the one or more alignment holes of the alignment tab to lock the retractable arm in the retracted position and align the ram piston, hoop portion, lower closure, and thermal chamber.

2. The loader assembly of claim 1, wherein the retractable arm further includes an actuator and a pivot arm connected to the hoop portion and pivots about a point, the actuator is connectable to the pivot arm and provides force to cause the pivot arm to move between the retracted position and the extended position.

3. The loader assembly of claim 2, wherein the actuator is one selected from the group comprising a hydraulic actuator, a mechanical worm drive, a mechanical lever driven by a motor or an electromechanical device.

4. The loader assembly of claim 2 further comprising:
a stationary lower clevis; and
an upper clevis on the pivot arm, wherein the upper clevis is rotatably connected to the stationary lower clevis and defines the point that the pivot arm pivots about.

5. The loader assembly of claim 1 further comprising one or more sensors operably associated with the retractable arm to determine the position of the retractable arm.

6. The loader assembly of claim 1 further comprising:
a second retractable arm moveable between a retracted position and an extended position;
a hoop portion of the second retractable arm moveable between the retracted position and the extended position;
a second lower closure removeably positioned in the hoop portion of the second retractable arm, wherein the ram piston contacts the second lower closure, extends through the hoop portion, and moves the second lower closure to the process position when the hoop portion is in the retracted position.

7. A loader assembly comprising:
a retractable arm that pivots about a point between a retracted position and extended position;
an upper clevis of the retractable arm rotatably connected to a stationary lower clevis, wherein the rotation of the upper clevis with respect to the stationary lower clevis defines the point that the retractable arm pivots between the retracted position and the extended position;
an actuator connected to the retractable arm for causing the upper clevis to rotate with respect to the stationary lower clevis;
a hoop portion of the retractable arm moveable between the retracted position and the extended position;
a lower closure removeably connected in the hoop portion;
a ram piston moveable between a load position and a process position, wherein the ram piston contacts the lower closure, extends through the hoop, and moves the lower closure to the process position when the ram piston moves from the load position to the process position;
a thermal chamber for receiving the lower closure when the ram piston moves to the process position;
an alignment tab extending from the hoop portion, wherein the alignment tab has one or more alignment holes; and
a shot pin with one or more alignment holes and one or more retractable pins capable of sliding through the one or more alignment holes of the shot pin and the one or more alignment holes of the alignment tab to lock the retractable arm in the retracted position and align the ram piston, hoop portion, lower closure, and thermal chamber.

8. The loader assembly of claim 7, wherein the actuator is one selected from the group comprising a hydraulic actuator, a mechanical worm drive, a mechanical lever driven by a motor or an electromechanical device.

9. The loader assembly of claim 7 further comprising one or more sensors operably associated with the retractable arm to determine the position of the retractable arm.

10. The loader assembly of claim 7 further comprising:
a second retractable arm moveable between a retracted position and an extended position;
a hoop portion of the second retractable arm moveable between the retracted position and the extended position;
a second lower closure removeably positioned in the hoop portion of the second retractable arm, wherein the ram piston contacts the second lower closure, extends through the hoop portion, and moves the second lower closure to the process position when the hoop portion is in the retracted position.

11. A method of operating loader assembly for a thermal energy method machine comprising the steps of:
providing a retractable arm having a hoop portion;
providing a lower closure removeably positioned in the hoop portion;
providing a ram piston and a thermal chamber;
moving the retractable arm to an extended position with the lower closure placed in the hoop portion;
placing a part onto the lower closure;
moving the retractable arm to a retracted position located above the ram piston;
moving the ram piston vertically from a load position to a process position, wherein the ram piston contacts the lower closure and extends through the hoop portion;
presenting the lower closure to the thermal chamber when the ram piston moves vertically to the process position;
activating the thermal chamber to process the part;
lowering the ram piston to the load position, wherein the ram piston removeably connects the lower closure to the hoop portion of the retractable arm;
moving the retractable arm from the retracted position to an extended position;
removing the processed part and placing a new part on the lower closure;
providing an alignment tab on the hoop portion of the retractable arm, wherein the alignment tab has one or more alignment holes;
providing a shot pin with one or more alignment holes and one or more retractable pins; and
wherein the step of moving the retractable arm to the retracted position located above the ram piston further includes moving the alignment tab into the shot pin such that the one or more alignment holes of the shot pin and the one or more alignment holes of the alignment tab are aligned where one or more retractable pins slide through the one or more alignment holes of the alignment tab and the one or more alignment holes of the shot pin to hold the hoop portion and lower closure in alignment with the ram piston and the thermal chamber.

12. The method of claim 11 further comprising the steps of:
providing a pivot arm and an actuator as components of the retractable arm; and
providing a lower stationary clevis and an upper clevis on the pivot arm, wherein the upper clevis rotates with respect to the stationary lower clevis as the pivot arm moves between the retracted position and the extended position.

13. The method of claim 12 further comprising the steps of wherein the actuator is moveable between an extended position and a retracted position and the actuator provides the force necessary for moving the pivot arm between the extended position and the retracted position.

14. The method of claim 11 further comprising the steps of:
providing one or more sensors operably associated with the retractable arm, wherein the one or more sensors determine the position of the retractable arm and in order to coordinate the movement of the retractable arm and the movement of the ram piston and activation of the thermal chamber.

15. A method of operating a loader assembly for a thermal energy method machine comprising the steps of:

providing a first retractable arm having a hoop portion and a second retractable arm having a hoop portion;

providing a first lower closure removably positioned in the hoop portion of the first retractable arm and a second lower closure removably positioned in the hoop portion of the second retractable arm;

providing a ram piston and a thermal chamber;

starting the loader assembly with the first retractable arm in the extended position and the second retractable arm in the extended position;

placing a part onto the first lower closure of the first retractable arm and placing a part onto the second lower closure of the second retractable arm;

moving the first retractable arm to a retracted position located above the ram piston;

moving the ram piston vertically from a load position to a process position, wherein the ram position contacts the first lower closure and extends through the hoop portion;

presenting the first lower closure to the thermal chamber, wherein the ram piston moves vertically to the process position;

activating the thermal chamber to process the part;

lowering the ram piston to the load position, wherein the ram piston removeably connects the first lower closure to the hoop portion of the first retractable arm;

moving the first retractable arm from the retracted position to the extended position and removing the processed part and placing a new part onto the first lower closure;

sequentially moving the second retractable arm from the extended position to the retracted position located above the ram piston;

moving the ram piston vertically from a load position to a process position, wherein the ram piston contacts the second lower closure and extends through the hoop portion;

presenting the second lower closure to the thermal chamber when the ram piston moves vertically to the process position;

activating the thermal chamber to process the part; lowering the ram piston to the load position, wherein the ram piston removably connects the second lower closure to the hoop portion of the second retractable arm;

moving the second retractable arm from the retracted position to an extended position and removing the processed part and placing a new part on the second lower closure;

providing an alignment tab on each of the hoop portion of the first retractable arm and the second retractable arm, wherein the alignment tab each have one or more alignment holes;

providing a shot pin where one or more alignment holes and one or more retractable pins; and wherein the step of moving the first retractable arm or the second retractable arm to the retracted position located above the ram piston further includes moving the alignment tab into the shot pin such that one or more alignment holes of the shot pin and one or more alignment holes of the alignment tab are aligned where one or more retractable pins slide through the one or more alignment holes of the alignment tab and the one or more alignment holes of the shot pin to hold the hoop portion and the lower closure in alignment with the ram piston and the thermal chamber.

16. The method of claim 15 further comprising the steps of:

providing a pivot arm and an actuator as components of each of the first retractable arm and the second retractable arm; and providing a lower stationary clevis and an upper stationary clevis on each of the pivot arms, wherein the upper clevis rotates with respect to the lower stationary clevis as the pivot arm moves between the retracted position and the extended position.

* * * * *

UNITED STATES PATENT AND TRADEMARK OFFICE
CERTIFICATE OF CORRECTION

PATENT NO. : 8,157,497 B2
APPLICATION NO. : 12/115566
DATED : April 17, 2012
INVENTOR(S) : Miles Edmond Loretta et al.

It is certified that error appears in the above-identified patent and that said Letters Patent is hereby corrected as shown below:

IN THE CLAIMS

In Column 6, Line 54, in Claim 13, delete "claim 12" and insert -- claim 11 --, therefor.

Signed and Sealed this
Twenty-third Day of April, 2013

Teresa Stanek Rea
*Acting Director of the United States Patent and Trademark Office*